(12) United States Patent
Muller et al.

(10) Patent No.: US 12,387,079 B2
(45) Date of Patent: Aug. 12, 2025

(54) METHOD OF MANUFACTURING AN ANIMAL TAG, AS WELL AS ANIMAL TAG

(71) Applicant: Nedap N.V., Groenlo (NL)

(72) Inventors: Roxie Sabri Romero Muller, Enschede (NL); Karen Elisa Damhuis, Losser (NL)

(73) Assignee: Nedap N.V., Groenlo (NL)

( * ) Notice: Subject to any disclaimer, the term of this patent is extended or adjusted under 35 U.S.C. 154(b) by 0 days.

(21) Appl. No.: 18/626,476

(22) Filed: Apr. 4, 2024

(65) Prior Publication Data

US 2024/0338548 A1 Oct. 10, 2024

(30) Foreign Application Priority Data

Apr. 6, 2023 (NL) ...................................... 2034514

(51) Int. Cl.
*G06K 19/077* (2006.01)
*A01K 11/00* (2006.01)
(Continued)

(52) U.S. Cl.
CPC ...... *G06K 19/07724* (2013.01); *A01K 11/006* (2013.01); *A01K 29/005* (2013.01);
(Continued)

(58) Field of Classification Search
CPC ............ G06K 19/07724; A01K 11/006; A01K 29/005
(Continued)

(56) References Cited

U.S. PATENT DOCUMENTS 7,772,979 B2 8/2010 Caisley
10,085,419 B2 * 10/2018 Zimmerman ........ A01K 5/0107
(Continued)

FOREIGN PATENT DOCUMENTS

AT 13811 U1 9/2014
FR 2963722 A1 2/2012

OTHER PUBLICATIONS

European Patent Office, Search Report and Written Opinion in corresponding Dutch Application No. 2034514 dated Oct. 13, 2023.

*Primary Examiner* — Allyson N Trail
(74) *Attorney, Agent, or Firm* — Leydig, Voit & Mayer, Ltd.

(57) ABSTRACT

An animal tag and a method of manufacturing the animal tag are described. The animal tag includes a printed circuit board for supporting an electronic circuit with electronic components, wherein the electronic components include a transceiver and an antenna circuit, and wherein the antenna circuit is communicatively connected to the transceiver for enabling the animal tag to communicate wirelessly with a further entity of the animal monitoring system. The method includes: fixing the printed circuit board supporting the electronic circuit in a first mold unit; performing a first overmolding, for embedding the printed circuit board supporting the electronic circuit in a molded interior part; transferring the molded interior part to a second mold unit and fixing the molded interior part in the second mold unit; performing a second overmolding that embeds the molded interior part in a water resistant part; and thereafter solidifying the water resistant part to yield the animal tag.

20 Claims, 3 Drawing Sheets

(51) Int. Cl.
*A01K 29/00* (2006.01)
*B29C 45/14* (2006.01)
*B29C 45/16* (2006.01)
*B29K 23/00* (2006.01)
*B29K 77/00* (2006.01)
*B29L 31/34* (2006.01)
*H05K 3/28* (2006.01)

(52) U.S. Cl.
CPC ......... *G06K 19/07773* (2013.01); *H05K 3/28* (2013.01); *B29C 45/14639* (2013.01); *B29C 45/1615* (2013.01); *B29C 45/1671* (2013.01); *B29K 2023/00* (2013.01); *B29K 2077/00* (2013.01); *B29L 2031/3425* (2013.01)

(58) Field of Classification Search
USPC ........................................................ 235/492
See application file for complete search history.

(56) References Cited

U.S. PATENT DOCUMENTS

| | | | |
|---|---|---|---|
| 2007/0137584 A1* | 6/2007 | Travis | A01K 5/02 119/51.02 |
| 2009/0288606 A1* | 11/2009 | Zimmerman | A01K 5/0225 119/51.01 |
| 2011/0108616 A1* | 5/2011 | Wang | G06K 7/0004 235/375 |
| 2021/0210170 A1* | 7/2021 | Gardner | G16H 70/40 |
| 2025/0061041 A1* | 2/2025 | Hernandez Herranz | G06F 11/3476 |

* cited by examiner

METHOD OF MANUFACTURING AN ANIMAL TAG, AS WELL AS ANIMAL TAG

CROSS-REFERENCE TO RELATED APPLICATIONS

This application claims priority to The Netherlands Application No. 2034514, filed Apr. 6, 2023, which is expressly incorporated by reference in its entirety, including any references contained therein.

TECHNOLOGY FIELD

The present disclosure is directed to a method of manufacturing an animal tag for use in an animal monitoring system, wherein the animal tag comprises a printed circuit board (PCB) that supports an electronic circuit including electronic components, and the electronic components include a transceiver and an antenna circuit. The antenna circuit is communicatively connected to the transceiver to enable the animal tag to communicate wirelessly with a further entity of the animal monitoring system. The disclosure is further directed at an animal tag used in an animal monitoring system.

BACKGROUND

Animal tags, for example for use in livestock monitoring systems, include various electronic circuits and components. Such tags are in use typically exposed to harsh environmental conditions, which may roughly vary from temperatures between −20 degrees Celsius and +45 degrees Celsius, and all possible weather conditions. The tags therefore require a protective housing that safely encloses the electronics and effectively protects the electronics against the above-indicated potentially harsh environmental conditions. At the same time, animal tags are used in relatively large numbers in a monitoring system and are to be designed such that they may be easily replaced. A plain design of the electronics as well as an easy to manufacture housing thereof is desired in order to render the design affordable.

In order to realize a protective enclosure, it is known to embed the electronics in thermoplastic material. For example, such protective enclosure may be achieved by casting or pouring the thermoplastic material into a mold that includes the electronics. A difficulty with such protective enclosure is that the electronics should also be protected against high temperatures and against excessive force during casting. As a result, the choice of materials for the thermoplastic material is limited, and thereby compromises the protective characteristics of the housing in the end product.

SUMMARY OF THE DISCLOSURE

A manufacturing method is disclosed that overcomes the disadvantages of the prior art, and that provides a cost effective solution for manufacturing animal tags that are securely protected against all weather conditions encountered in use.

To this end, there is provided herewith a method of manufacturing an animal tag as described above, wherein the method comprises the steps of: a. fixing the printed circuit board supporting the electronic circuit in a first mold unit; b. performing a first step of overmolding, for embedding the printed circuit board supporting the electronic circuit in a molded interior part; c. transferring the molded interior part to a second mold unit and fixing the molded interior part in the second mold unit; d. performing a second step of overmolding, for embedding the molded interior part in a water resistant part; and e. solidifying the water resistant part such as to yield the animal tag.

To overcome the disadvantages of the prior art, in accordance with the present disclosure, the manufacturing methods in accordance with embodiments of the present disclosure apply two subsequent steps of overmolding. Both these steps may be applied under different operating parameters. In this manner, the step of overmolding the electronics is separated from a further step of overmolding. This enables to partly release the requirements for the thermoplastic material that is used in the first overmolding step (step b.) in order to create the molded interior part, because the molded interior part is later to be overmolded during the second overmolding step (step d.) in order to provide the water resistant part (i.e. creating a water resistant layer or housing around the molded interior part). The molded interior part, during the second overmolding step, protects the electronics from e.g. the potentially higher temperatures required to perform this step. Therefore, the requirements defining the choice of materials that can be used during the second overmolding step are likewise released, allowing a greater range of material that may be used to create the water resistant part.

In accordance with some embodiments, the molded interior part is formed of a first polymer material and the water resistant part is formed of a second polymer material. The first polymer material is different from the second polymer material. The materials applied in steps b. and d. may be different material, such that they match best with the requirements of each step. The materials may be completely different polymers, i.e. having a different chemical composition, or may be more alike. For example, it is also possible that different grades of a same polymer is applied in steps b. and d.; or that additives are added in any of the steps b. or d. in order to match the processing conditions of the material with those desired during the overmolding step without compromising the characteristics of the molded interior part or water resistant part respectively.

For example, in some embodiments, the first polymer material is a thermoplastic polymer, in particular a hot melt, that is processable at a first pressure, the first pressure being sufficiently low such as to prevent damage to the electronic circuit. In particular, the first pressure may be lower than 10 bar (i.e. lower than $1.0 \cdot 10^{-6}$ N/m$^2$ (newton-per-square-meter)) in order to cast the overmold at a pressure wherein it does not harm the electronic circuit or the electronic elements.

Furthermore, in some of these or other embodiments, the first polymer material is a thermoplastic polymer, in particular a hot melt, wherein the first polymer material, as measured at a temperature of 240 degrees Celsius, has a viscosity of at most 6 Pascal-seconds. The viscosity may be determined in accordance with the ASTM D3236 standard test; i.e. the standard test method for apparent viscosity of hot melt adhesives and coating materials. In these tests, a representative sample of the molten material to be tested is maintained in a thermally controlled sample chamber. Apparent viscosity is determined under temperature equilibrium conditions using a precision rotating spindle type viscometer. Various different manners are available to the skilled person in order to perform the above tests, for example applying calibration fluids, viscometers and accessories that may be obtained from Brookfield Engineering Laboratories, Inc., Stoughton, MA 02072, USA. Calibration fluids may likewise be obtained at Cannon Instrument Co., P. O. Box 16, State College, PA 16801, USA.

In other or further embodiments, the first polymer material has a first water absorption capability. Herein, the second polymer material is a thermoplastic polymer having a second water absorption capability that is lower than the first water absorption capability of the first polymer material. For example, the water absorption capability may be determined using the standard ISO 62. For plastics, the standard ISO 62 relates to the determination of water absorption. Other standard test methods for water absorption of plastics may also be used (e.g. ASTM D570), as long as the water absorption capability of the first and the second polymer material are determined using the same standard test method in order to allow comparison of the results. For example, in some embodiments, the second water absorption capability is lower than 1.0%, preferably lower than 0.75%, as measured at a temperature of 23 degrees Celsius using the above standards. In order to provide the additional protection against water (i.e. water resistance), the water absorption capability of the outer water resistant part must be lower than that of the mold interior part. For example, the first polymer material may be a polyamide hotmelt material that is well applicable at a temperature of 230 degrees Celsius, but that after solidifying thereof exhibits a water absorption capability of more than 1%. Over time, if the molded interior part would be not protected or would be insufficiently protected, this could result in moist accumulating therein to an undesired level. This could harm the electronics or shorten the lifetime of the animal tag. As second polymer material, for example a polyolefin grade may be applied that exhibits a water absorption capability lower than 1% in order to shield the interior part from the environment. For example, the water absorption capability may preferably be significantly lower than 1%.

Furthermore, in some embodiments, the first polymer material has a first melting temperature, wherein the second polymer material has a second melting temperature, and wherein the second melting temperature is lower than the first melting temperature, or wherein the second melting temperature is at most 70 degrees higher than the first melting temperature. As mentioned herein above, the molded interior part manufactured using the first polymer material protects the electronics from any properties or application conditions of the second polymer material. Thus, the application temperature of the second polymer material may be significantly higher than that of the first polymer material. The advantage thereof is that this allows a large range of additional candidate materials that may be applied during the second overmolding step (step d.). For example, if for a short duration, the application temperature of the second polymer material would be 50 or 60 degrees higher than the melting temperature of application temperature of the first polymer material, the solidified molded interior part protects the electronics from being exposed to these high temperatures directly.

In some embodiments, the first polymer material comprises a polyamide, such as a polyamide hot melt resin. In some embodiments, the first polymer material comprises a polyolefin, such as a polyolefin hot melt material. In other or further embodiments, the second polymer material comprises at least one element of a group comprising: a polyamide, such as Nylon™ (PA6); an acrylonitrile styrene acrylate (ASA), a polypropylene (PP), a polyethylene (PE), a polyoxymethylene (POM), polyvinylchloride (PVC), polystyrene (PS).

In some embodiments, prior to step a, the printed circuit board is mounted to a base part, and wherein the base part after step d forms part of the water resistant part. The benefit thereof is that base part may be fixed to the first mold that is applied during the first overmolding step. This first fixing to the base part may—dependent on the design of the base part and the PCB—be sufficient in order to stably fix the PCB during the first overmolding step at relatively low pressures. In some of these embodiments, the base part, in step c, is fixed to the second mold unit such that after step d, the base part forms part of the water resistant part.

Furthermore, in other or further embodiments, in step b. the molded interior part is formed such that it includes an attachment opening for enabling attachment of the animal tag to an animal. This enables the animal tag to be fixed to the animal, for example as in an car tag. In some of these embodiments, in step c. the fixing of the molded interior part in the second mold unit is performed by obtaining a fixating contact between a fixation part of the second mold and an internal surface of the attachment opening in the molded interior part. The attachment opening provides a well useable location for fixation of both the PCB in step a. as well as the base part in step c. If no base part is provided, the PCB may still be fixed via the attachment opening if this is present. If a base part is provided and the PCB is fixed thereto during manufacturing, if desired both during steps a. and c. the fixing to the respective first and second mold may be achieved via a fixation point internal to the attachment opening (e.g. on the internal surface of the opening).

In some embodiments, the first step of overmolding in step b. is performed at a first pressure, and the second step of overmolding in step d. is performed at a second pressure, wherein the first pressure is lower than the second pressure. For example, in the above example of performing the first overmolding step at 10 bar, the second overmolding step may be applied-if necessary—at much higher pressures (e.g. 50 bar or 100 bar, although these are merely non-limiting examples).

In some embodiments, in step a. the printed circuit board is fixed by at least one of: temporarily attaching in at least two fixing locations thereof, the at least two fixing locations being remote from the electronic circuit with the electronic components; or where the printed circuit board comprises a functional opening, by establishing contact in the functional opening; or both by temporarily attaching in at least two fixing locations thereof, the at least two fixing locations being remote from the electronic circuit with the electronic components, and where the printed circuit board comprises a functional opening, by establishing contact in the functional opening. Any of the above methods of fixation may be used advantageously.

In accordance with a second aspect of the present disclosure, there is provided an animal tag for use in an animal monitoring system. The animal tag is manufactured using a manufacturing method in accordance with any embodiment of the method of the first aspect. The animal tag comprises a printed circuit board for supporting an electronic circuit with electronic components, the electronic components including a transceiver and an antenna circuit, wherein the antenna circuit is communicatively connected to the transceiver for enabling the animal tag to communicate wirelessly with a further entity of the animal monitoring system. The printed circuit board that supports the electronic circuit is embedded in a molded interior part obtained by overmolding of the printed circuit board with a flexible material. The molded interior part is embedded in a water resistant part that is at least partly obtained by overmolding of the molded interior part with a water resistant material.

In some embodiments, the animal tag further comprises an attachment opening, wherein at least one of: the attachment opening runs through the molded interior part; or the attachment opening is present in the printed circuit board. Furthermore, in some embodiments, the animal tag is at least one of: an car tag, a neck tag, a tail tag, a leg tag, a stomach sensor bolus.

BRIEF DESCRIPTION OF THE DRAWINGS

The disclosure of illustrative examples of the present invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION OF THE DRAWINGS

Figure 1:
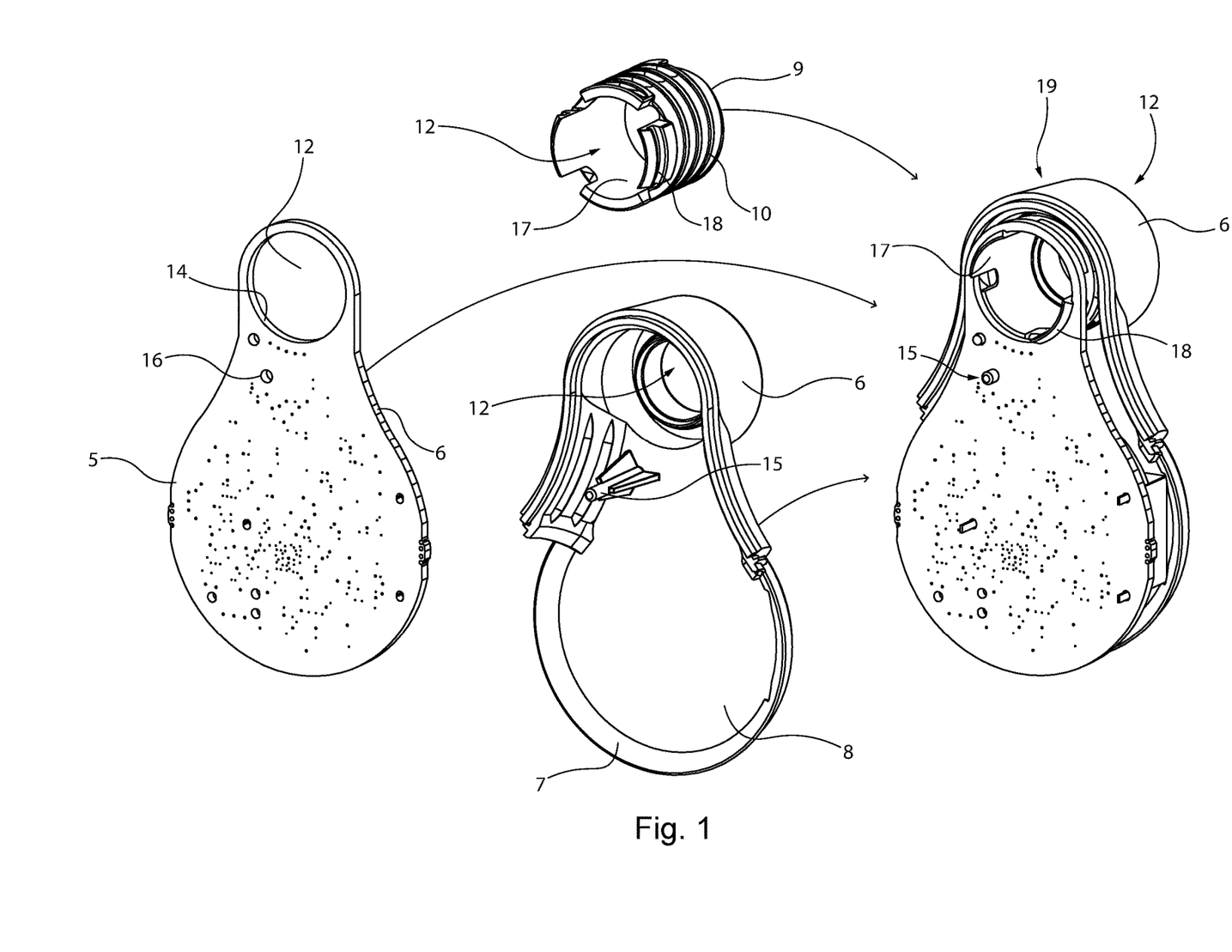
FIG. 1 schematically illustrates the various parts of an animal tag in accordance with an embodiment of the present disclosure.
Figure 2A:
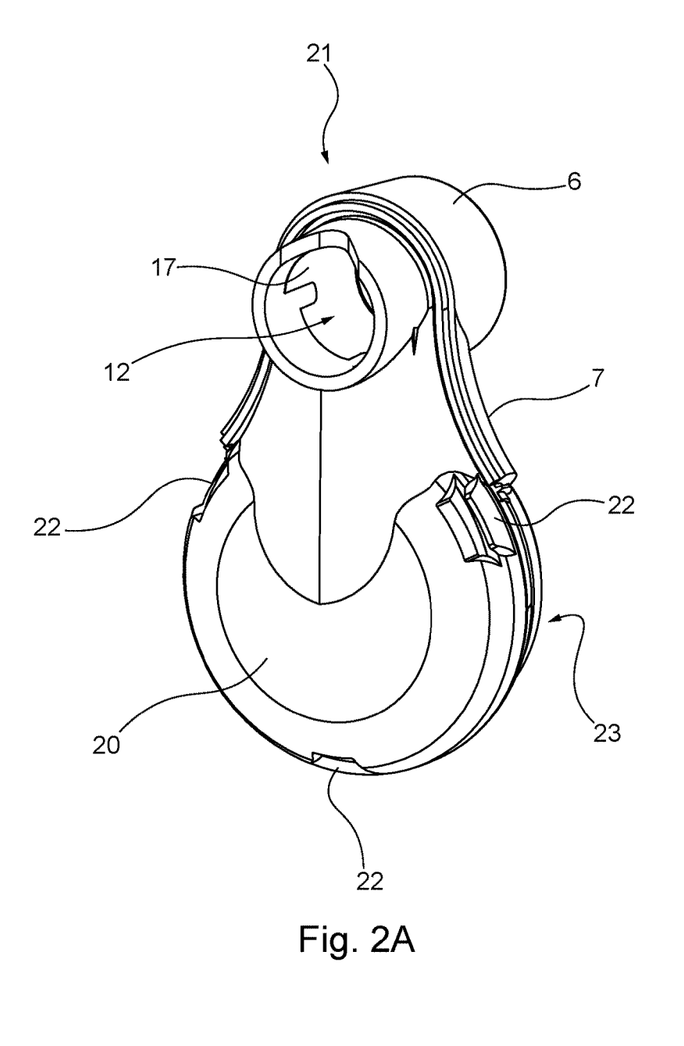
FIGS. 2a and 2b schematically and respectively illustrate a semi-manufactures and an end product of a method in accordance with an embodiment of the present disclosure.
Figure 2B:
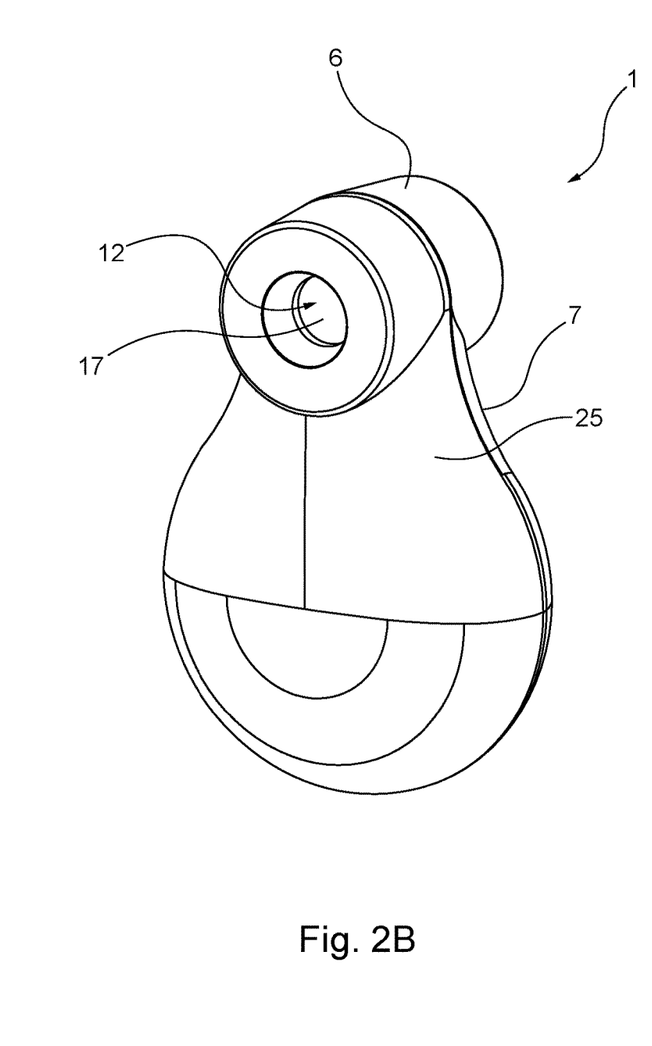

FIG. 1 schematically illustrates various parts of an animal tag in accordance with an embodiment of the present disclosure. The animal tag 1 (see FIG. 2b for the numbering) includes a printed circuit board 5, a base part 7, and a coil holder 9. Assembled, prior to overmolding in step 34 (e.g. FIG. 3), the various parts 5, 7 and 9 are illustrated in semi-manufacture part 19. The printed circuit board (PCB) 5 includes an attachment opening 12 that later forms the attachment opening of an car tag 1. Although FIGS. 1, 2a and 2b illustrate an car tag, the same manufacturing method may for example be applied for forming a neck tag, a tail tag, a leg tag or a stomach bolus. The example of an car tag 1 is described here in order to illustrate the method of the present disclosure, although the disclosure is not limited to the manufacturing of car tags alone, and may be applied to other type of animal sensor tags for use in livestock management systems.

The attachment opening 12 is further present in the base part 7 as well as in the coil holder 9. In the semi-manufacture 19, the attachment opening 12 is likewise visible. As may be appreciated, the inner surface 17 of the coil holder 9 forms the inner surface 17 of the attachment opening 12 in the semi-manufacture 19. Again, in FIGS. 2a and 2b, the inner surface 17 of the coil holder 9 will likewise form an accessible surface 17 of the final car tag 1.

Again, in FIG. 1, the printed circuit board 5 may include one or more mounting locations. For example, the opening 16 in the printed circuit board 5 will correspond with an extending mounting element 15 on the base part 7. Also, circumferential rim 14 of the attachment opening 12 in printed circuit board 5 will correspond to the outer surface of the edge 18 of the coil holder 9. The coil holder 9 may be placed into the attachment opening 12 of the printed circuit board, after which an antenna (not shown) can be wound around the coil holder 9. The grooves 10 in coil holder 9 provide guides for an antenna coil to be wound around the coil holder 9. In the semi-manufacture 19, the end of the extending parts 15 of the base part 7 can be seen to extend through the opening 16 in the printed circuit board 5. Also, the fixation of edge 19 through the printed circuit board 5 can be seen in the semi-manufacture 19.

The base part 7 comprises a housing part 8 that will in a later stage of the manufacturing process become part of the water resistant housing 25 (FIG. 2b) around the molded interior part, as will be explained below. Furthermore, apart from interior surface 17 of the attachment opening 12, in semi-manufacture 19 it can also be seen that the outer surface 6 of the base part 7 may likewise form a suitable fixation during the overmolding steps (both accessible during the first overmolding and the second overmolding step) of the manufacturing method.

As has already been explained above, base part 7 is an optional element to the animal tag 1 manufactured using a manufacturing method in accordance with an embodiment of the present disclosure. In other or further embodiments, it is also possible to fixate the PCB 5 (e.g. with or without coil holder 9) during a first overmolding step 34 in order to yield a molded interior part 20, and thereafter to fixate the molded interior part 20 in a second mold for performing a second overmolding step 40 in order to yield the water resistant part 25 that completely encloses the molded interior part 20. Fixation may for example in both overmolding steps be achieved through an attachment opening 12, which provides a commonly accessible fixation surface (such as internal surface 17) during both overmolding steps.

FIG. 2a illustrates a semi-manufacture 21 of an car tag 1 after the first molding step has been completed. As follows from 2a, the internal surface 17 of attachment opening 12 as well as the other surface 6 of the base part 7 can be seen. On the backside 23 of the semi-manufacture 21, the backside of the housing 8 visible in FIG. 1 will likewise be accessible, but may not always provide a good fixation location during the overmolding step. However, although this is not the case in FIGS. 1, 2a and 2b, the backside of housing 8 may optionally have been provided with surface structures, notches or indentations, which could provide suitable fixation points. In FIG. 2a, during the first overmolding step 34, additional fixation points 22 have been used in order to fix the printed circuit board 5 to the first mold (not visible). For example, fixation may have been achieved by clamping the circumference 6 of the printed circuit board 5 visible in FIG. 1. The shape of the clamps is still visible in FIG. 2a in the molded interior part 20 obtained during the first molding step.

In FIG. 2b, the car tag 1 is illustrated resulting from the manufacturing method of the present disclosure. Still visible are the attachment opening 12 with its internal surface 17. The water resistant part 25 or water resistant water housing 25 is obtained by the second overmolding step 40 of the present disclosure. Also, the exterior base part 7 can be seen to be integrated into the water resistant part 25. For example, the material from which the base part 7 is fabricated may be the same material used for performing the second overmolding step 40.

Figure 3:
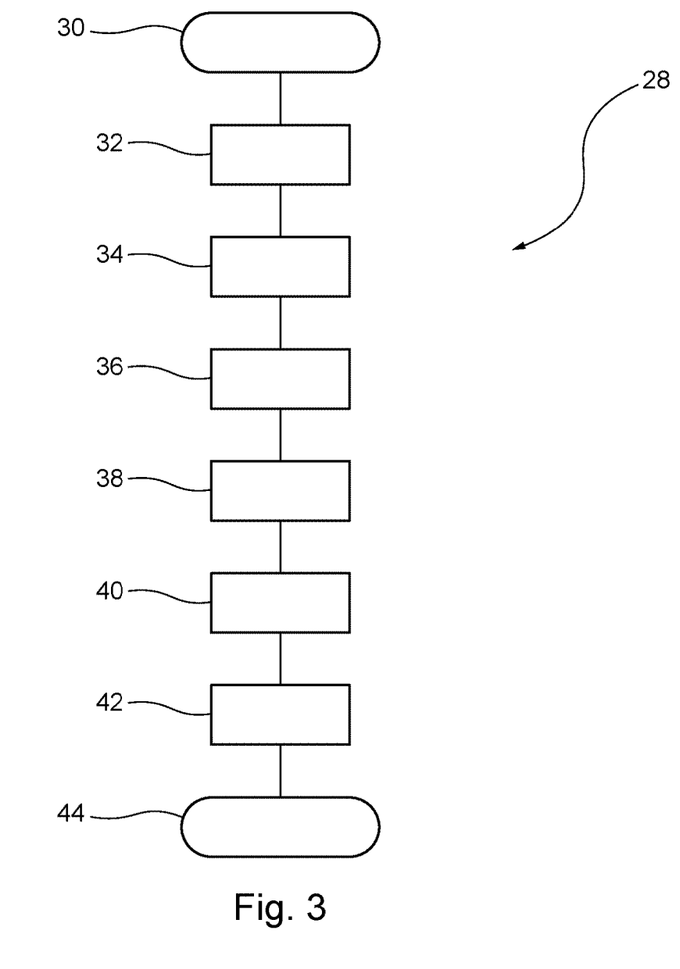
FIG. 3 schematically illustrates a method in accordance with an embodiment of the present disclosure.

FIG. 3 schematically illustrates a method in accordance with an embodiment of the present disclosure. The method 28 starts with optional preprocessing in step 30. The preprocessing step 30 may include for example the assembly of the various parts 5, 7 and 9 such as to form semi-manufacture 19 of FIG. 1. If the base part 7 is absent, this may merely include the attachment of the printed circuit board 5 through the coil holder 9. In case of a neck tag or other kinds of tags, these could of course be other parts that are assembled in order to form a semi-manufacture.

In step 32, the semi-manufacture 19 may be fixed to the first mold for performing the first overmolding step 34. For example in some embodiments, fixation of the semi-manufacture 19 may include fixating the printed circuit board 5 to clamps or other holding part in the mold for performing the overmolding step 34. Furthermore, in some embodiments, the semi-manufacture 19 may be completely fixed by fixing the internal surface 17 of the attachment opening.

In step 34, a first step of overmolding is carried out. The overmolding is performed by casting, under pressure, a first polymer material into the mold wherein the PCB 5 recites. For example, the first polymer material may be a polyamide hot melt that is characterized by having a relatively low viscosity at a temperature of 230 degrees Celsius. As mentioned herein before, for example the viscosity may be less than 6.0 Pa's at a temperature of 240 degrees Celsius. The test to be performed may be standard test ASTM D3236. For example, at an application temperature of 230 degrees Celsius the viscosity could be 3.0 to 4.0 Pa·s.

In step 36 the molded interior part 20 obtained in step 34 is solidified. The solidifying step may for example have a duration of several hours to several days in order to achieve the desired hardness of the hot melt material. The hardness of the molded interior part may for example be at least 30 Shore D, more preferably at least 40 Shore D at a temperature of 23.0 degrees Celsius. This can be determined in accordance with the standard test ISO868 for determination of indentation hardness by means of a durometer (Shore hardness) of plastics and ebonite. A suitable material that may be used may for example be a polyamide hold melt resin sold under the name Thermelt™ 195 natural, of Bostik S.A., la Plaine Saint-Denis France. Another suitable polyamide hot melt may for example be provided by the polyamide hot melt resin sold by Henkel AG & Co KGaA of Düsseldorf, Germany under the name Macromelt® 2035S. As may be appreciated, the above-mentioned materials are merely examples of suitable polyamide hot melt materials that may be used for producing the molded interior part 20 of the present disclosure.

In step 38, the solidified molded interior part 20 is fixed in a second mold in order to perform the second molding step. For example, where the molded interior part comprises an attachment opening 12 as illustrated in FIGS. 1 and 2, the fixation location may be chosen to be internal to the attachment opening 12 in order to fix the semi-manufacture 21 to the second mold for performing the second overmolding step. In step 40, the second overmolding is performed using a second polymer material. The second polymer material may be selected in order to provide a water resistant layer or a water resistant housing that encloses the molded interior part 20. The molded interior part 20 is thereby fully enclosed by the water resistant part 25, and thereby the electronics embedded in the molded interior part 20, are fully protected against moist during their lifetime. Various suitable materials may be applied during the second overmolding step 40, dependent on the properties desired. For example, for obtaining water resistancy various plastics such as Nylon™ (PA6), an acrylonitrile styrene acrylate (ASA), a polypropylene (PP), a polyethylene (PE), a polyoxymethylene (POM), polyvinylchloride (PVC), polystyrene (PS) may be considered. As may be appreciated, a second polymer material is a different material than the first polymer material, and may for example be provided by a plastic that provides a high level of water resistance or may even be a different grade of a same or similar polymer that is already applied in the first overmolding step 34.

The temperatures applied in the overmolding steps 34 and 40 may suitably be chosen dependent on the hot melt materials applied. During the second overmolding step 40, because the electronics are protected by the molded interior part 20 obtained during the first step 34, the temperatures during this step 40 may be higher than the temperatures during step 34 for a limited amount of time. This, of course, is optional—the temperatures may also be selected to be lower during the second step 40 compared to the first step 34 if this is preferred dependent on the material applied during the second step 40.

In step 42, the water resistant part is solidified for several hours to several days in order to obtain the end product, an (operational) animal tag 1. Optionally, various post-processing steps may be applied. For example, the imprinting of information on the tag or other post-processing steps to the tag in step 44. Furthermore, as may be appreciated, although the method of the present disclosure may include the above mentioned and described step, additional steps may be added in order to provide certain functionality to the animal tag 1 or in order to improve various aspects of the manufacturing method described. This may be considered without departing from the present disclosure of illustrative examples. Furthermore, various ones of the above-mentioned methods may be optional, such as the preprocessing step 30 or the post-processing step 44.

The present disclosure of illustrative examples has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible that should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus, the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Any of the claimed or disclosed devices or portions thereof may be combined together or separated into further portions unless specifically stated otherwise, without departing from the claimed invention. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

What is claimed is:

1. A method of manufacturing an animal tag for use in an animal monitoring system, wherein the animal tag comprises a printed circuit board for supporting an electronic circuit with electronic components, wherein the electronic components include a transceiver and an antenna circuit, and wherein the antenna circuit is communicatively connected to the transceiver for enabling the animal tag to communicate wirelessly with a further entity of the animal monitoring system; wherein the method of manufacturing comprises:
fixing the printed circuit board supporting the electronic circuit in a first mold unit;
first embedding, by performing a first overmolding at the first mold unit, the printed circuit board supporting the electronic circuit in a molded interior part;
transferring the molded interior part, with the embedded printed circuit board, to a second mold unit and fixing the molded interior part in the second mold unit;
fully embedding, by performing a second overmolding at the second mold unit, the molded interior part in a water resistant part, so that the water resistant part completely encloses the molded interior part; and
solidifying the water resistant part to yield the animal tag including the printed circuit board.

2. The method according to claim 1, wherein the molded interior part is formed of a first polymer material, and wherein the water resistant part is formed of a second polymer material, the first polymer material being different from the second polymer material.

3. The method according to claim 2, wherein the first polymer material is a thermoplastic polymer that is processable at a first pressure, the first pressure being sufficiently low to prevent damage to the electronic circuit.

4. The method according to claim 2, wherein the first polymer material is a thermoplastic polymer, wherein the first polymer material, as measured at a temperature of 240 degrees Celsius, has a viscosity of at most 6 Pascal-seconds.

5. The method according to claim 2, wherein the first polymer material has a first water absorption capability, and wherein the second polymer material is a thermoplastic polymer having a second water absorption capability that is lower than the first water absorption capability of the first polymer material.

6. The method according to claim 5, wherein the second water absorption capability is lower than 1.0%, as measured at a temperature of 23 degrees Celsius.

7. The method according to claim 6, wherein the base part, during the fixing, is fixed to the second mold unit such that after the fully embedding, the base part forms part of the water resistant part.

8. The method according to claim 2, wherein the first polymer material comprises at least one element taken from the group consisting of: a polyamide; and a polyolefin.

9. The method according to claim 8, wherein the second polymer material comprises at least one element of the group consisting of: a polyamide; an acrylonitrile styrene acrylate, a polypropylene, a polyethylene, a polyoxymethylene, polyvinylchloride, and polystyrene.

10. The method according to claim 1, wherein, prior to the fixing the printed circuit board in the first mold unit, the printed circuit board is mounted to a base part, and
wherein the base part after the fully embedding forms part of the water resistant part.

11. The method according to claim 1, wherein, during the first embedding, the molded interior part is formed to include an attachment opening enabling attachment of the animal tag to an animal.

12. The method according to claim 11 wherein, during the fixing, the fixing of the molded interior part in the second mold unit is performed by obtaining a fixating contact between a fixation part of the second mold and an internal surface of the attachment opening in the molded interior part.

13. The method according to claim 1, wherein the overmolding, during the first embedding, is performed at a first pressure,
wherein the overmolding during the fully embedding is performed at a second pressure, and
wherein the first pressure is lower than the second pressure.

14. The method according to claim 1, wherein, during the fixing the printed circuit board in the first mold unit, the printed circuit board is fixed by performing at least one operation taken from the group consisting of:
temporarily attaching in at least two fixing locations thereof, the at least two fixing locations being remote from the electronic circuit with the electronic components; and
establishing contact, where the printed circuit board comprises a functional opening, in the functional opening.

15. The method according to claim 2, wherein the second polymer material comprises at least one element of the group consisting of: a polyamide; an acrylonitrile styrene acrylate, a polypropylene, a polyethylene, a polyoxymethylene, polyvinylchloride, and polystyrene.

16. An animal tag for use in an animal monitoring system,
wherein the animal tag comprises a printed circuit board for supporting an electronic circuit with electronic components, the electronic components including a transceiver and an antenna circuit, wherein the antenna circuit is communicatively connected to the transceiver for enabling the animal tag to communicate wirelessly with a further entity of the animal monitoring system,
wherein the printed circuit board that supports the electronic circuit is embedded in a molded interior part obtained by overmolding of the printed circuit board with a flexible material,
wherein the molded interior part is fully embedded in a water resistant part that completely encloses the molded interior part, such that the water resistant part is at least partly obtained by overmolding of the molded interior part with a water resistant material; and
wherein the animal tag is manufacture according to a method comprising:
fixing the printed circuit board supporting the electronic circuit in a first mold unit;
embedding, by performing a first overmolding at the first mold unit, the printed circuit board supporting the electronic circuit in a molded interior part;
transferring the molded interior part, with the embedded printed circuit board, to a second mold unit and fixing the molded interior part in the second mold unit;
embedding, by performing a second overmolding at the second mold unit, the molded interior part in a water resistant part; and solidifying the water resistant part to yield the animal tag including the printed circuit board.

17. The animal tag according to claim 16, wherein the flexible material comprises a first polymer material, and wherein the water resistant material comprises a second polymer material, and wherein the first polymer material is different from the second polymer material.

18. The animal tag according to claim 16, wherein at least a part of the water resistant part is provided by a base part, and wherein the base part is mounted directly to the printed circuit board, the mounting being performed prior to said overmolding of the molded interior part with the water resistant material.

19. The animal tag according to claim 16, wherein the animal tag further comprises an attachment opening, wherein the attachment opening has at least one physical feature taken from the group consisting of:
   the attachment opening runs through the molded interior part; and
   the attachment opening is present in the printed circuit board.

20. The animal tag according to claim 16, wherein the animal tag is at least one tag type taken from the group consisting of: an ear tag, a neck tag, a tail tag, a leg tag, and a stomach sensor bolus.

\* \* \* \* \*